United States Patent [19]

Lequime

[11] Patent Number: 5,229,834
[45] Date of Patent: Jul. 20, 1993

[54] SENSOR FOR DETECTING AND MEASURING THE ANGLE OF ROTATION OF A PLANE OF LIGHT POLARIZATION

[75] Inventor: Michel Lequime, Eguilles, France

[73] Assignee: Bertin & Cie, Plaisir, France

[21] Appl. No.: 761,861

[22] PCT Filed: Jan. 11, 1991

[86] PCT No.: PCT/FR91/00014
§ 371 Date: Sep. 9, 1991
§ 102(e) Date: Sep. 9, 1991

[87] PCT Pub. No.: WO91/10886
PCT Pub. Date: Jul. 25, 1991

[30] Foreign Application Priority Data

Jan. 12, 1990 [FR] France ................. 90 00318

[51] Int. Cl.⁵ ............................. G01J 4/04
[52] U.S. Cl. .......................... 356/365; 356/150; 250/225
[58] Field of Search ............ 356/351, 364, 365, 366, 356/367, 368, 150; 250/225

[56] References Cited

U.S. PATENT DOCUMENTS

| | | | |
|---|---|---|---|
| 3,520,617 | 7/1970 | Webb | 356/365 |
| 4,709,145 | 11/1987 | Spillman | 250/225 |
| 4,749,854 | 6/1988 | Martens | 356/365 |
| 4,883,952 | 11/1989 | Jones | 250/225 |

FOREIGN PATENT DOCUMENTS 1189758 3/1965 Fed. Rep. of Germany.
2618953 11/1976 Fed. Rep. of Germany.
2854064 6/1979 Fed. Rep. of Germany.

*Primary Examiner*—Richard A. Rosenberger
*Attorney, Agent, or Firm*—Bell, Seltzer, Park & Gibson

[57] ABSTRACT

The sensor for detecting and measuring the angle of rotation of the polarization plane of light delivered by a sensitive system (19) subjected to an external phenomenon such as a magnetic field, for example, with the sensor being connected via an optical fiber (18) to a source of incoherent light (10) and essentially comprising the sensitive system (19), a quarterwave plate (22), a birefringent crystal (24), and an analyzer (26). The light flux provided by the sensor is spectrally modulated as a function of the angle of rotation of the plane of polarization of the light delivered by the above-mentioned system (19).

14 Claims, 2 Drawing Sheets

SENSOR FOR DETECTING AND MEASURING THE ANGLE OF ROTATION OF A PLANE OF LIGHT POLARIZATION

The invention relates to a sensor for detecting and measuring the angle of rotation of a plane of light polarization, the sensor including a polarizing optical component which is subjected to an external influence that causes the plane of polarization delivered by said component to be rotated.

Sensors for detecting and measuring physical magnitudes such as temperature or a displacement and which are of the type that uses light spectrum modulation encoding are already known. Essentially they comprise a polarizer, a birefringent crystal subjected to the physical magnitude to be measured, and an analyzer, with such sensors being connected by optical fibers firstly to a source of incoherent light and secondly to light spectrum analysis apparatus, generally comprising a demodulator interferometer. In such sensors, the light spectrum delivered by the optical fiber is modulated periodically at a frequency which is a function of the path length difference within the birefringent crystal, said path length difference itself being a function of the physical magnitude to be measured.

Such sensors may be used in locations that are not easily accessible and/or in a dangerous environment and/or situated at relatively long distances from the light source and the light analyzing apparatus.

An essential object of the invention is to provide a sensor for detecting and measuring the angle of the rotation of a plane of light polarization that provides the same advantages as prior sensors of the light spectrum modulation type.

To this end, the present invention provides a sensor for detecting and measuring the angle of rotation of a plane of light polarization, the sensor comprising a source of incoherent light, an optical fiber connecting the source to a polarizing optical system subjected to an external influence that causes a rotation in the plane of polarization of the light delivered by the system, the sensor being characterized in that said system is associated with a light spectrum modulator device essentially comprising a birefringent crystal and an analyzer, and with an achromatic quarterwave plate placed before or after the birefringent crystal.

The sensor of the invention provides light flux whose spectrum is modulated at a frequency which is a function firstly of the path length difference in the birefringent crystal and secondly of the angle rotation of the plane of light polarization delivered by the above-mentioned optical system.

Demodulating this light flux thus makes it possible to retrieve this angle of rotation, given that the path length difference in the birefringent crystal is known.

The sensor of the invention may operate in transmission, in which case it is connected at its end facing away from the light source to a demodulator interferometer.

Alternatively it may operate in reflection, with its end facing away from the light source including optical reflection means, and preferably of the retroreflecting type, the above-mentioned analyzer being placed between the birefringent crystal and said optical reflection means.

In one embodiment of this sensor, the above-mentioned optical system is a polarizer associated with a magneto-optical component subjected to a magnetic field.

In this case, the magnetic field may be determined by measuring the angle of rotation of the plane of polarization of the light delivered by the magneto-optical component. It is thus possible to measure an electrical current that is producing the magnetic field.

In a variant, the above-mentioned system may be a single polarizer mounted to rotate about the optical axis of the sensor. In this case, it is possible to measure the angular position of the polarizer or its speed of rotation.

In another variant, and when the sensor operates in transmission, the above-mentioned optical system includes a polarizer and an active element of the rotatory polarization type, such as a cholesteric crystal, for example, having relatively high rotatory power which is a function of temperature.

When the external phenomenon is of the alternating variation type, the sensor is connected to an analysis apparatus comprising a differential amplifier circuit, an analog phase calculating circuit, and filters tuned respectively to a base frequency corresponding to twice the angular frequency of the external phenomenon and to harmonics of said base frequency.

The invention will be better understood and other characteristics, details, and advantages thereof will appear more clearly on reading the following description made with reference to the accompanying drawings, in which.

Figure 1:
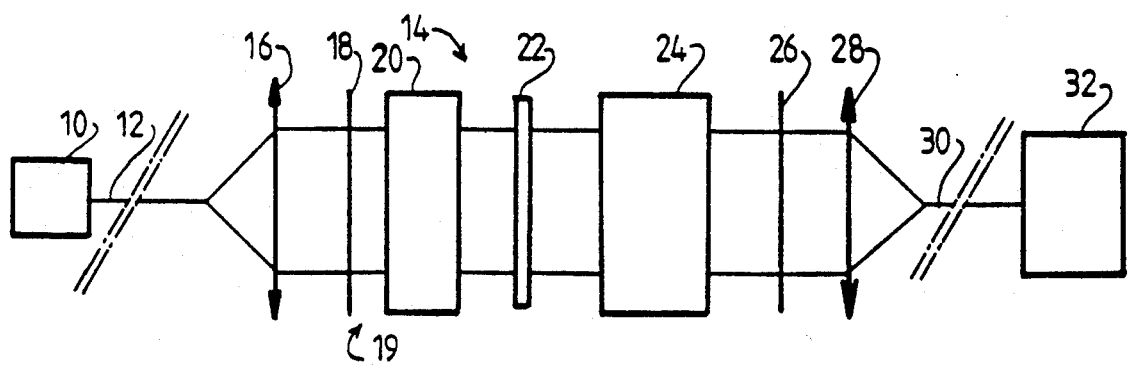
FIG. 1 is a diagrammatic view of a detection and measurement system including a sensor of the invention.

Reference is made initially to FIG. 1 which is a diagram of an embodiment of a measurement system including a sensor of the invention of the type operating in transmission.

This system comprises a source 10 of incoherent light connected by an optical fiber 12 to the sensor of the invention given an overall reference 14.

This sensor is connected to the optical fiber 12 by a collimator lens 16 followed by a transducer system 19 capable of producing a linearly polarized light flux with the angular orientation of the plane of polarization being a function of the physical parameter transduced by the system 19.

By way of example, the transducer system 19 may:

include a fixed polarizer 18 and a magneto-optical type sensitive component 20 for measuring a magnetic field; or be constituted by a single rotating polarizer 18 for the purpose of measuring an angle or a speed of rotation.

The system 19 is followed by an achromatic quarterwave plate 22 which may be placed before or after a birefringent crystal 24. An analyser 26 is placed between the crystal 24 and a collimator lens 28 connecting the sensor 14 to an optical fiber 30 leading to an apparatus 32 for analyzing the spectrum of the light flux delivered by the sensor.

Figure 2:
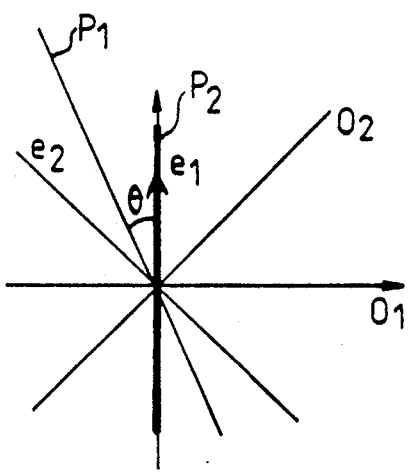
FIG. 2 is a diagram showing the relative orientations of the various components of the sensor.

The relative orientations of the various components of the sensor 14 are indicated diagrammatically in FIG. 2.

The neutral axes o1 and e1 of the quarterwave plate 22 are oriented at 45° to the neutral axes o2 and e2 of the birefringent crystal 24. The light-passing direction P2 of the analyzer 26 coincides with one of the neutral axes of the quarterwave plate 22, whereas the polarization plane of the light delivered by the system 19 is at an angle $\theta$ with the light-passing direction of the analyzer 26.

The light flux delivered by the sensor 14 may be written in the following form:

$$P_c(\sigma) = T_c P_o(\sigma)[1 + \cos(2\pi\sigma e \Delta n - 2\theta)]$$

where:
$P_c(\sigma)$ = light flux leaving the sensor
$P_o(\sigma)$ = light flux delivered by the source 10
$\sigma$ = wave number
$T_c$ = transmission factor of the sensor
$e$ = thickness of the birefringent crystal 24
$\Delta n$ = the difference between the refractive indices of the birefringent crystal 24
$\theta$ = the angular position of the plane of polarization delivered by the transducer system 19

When the transducer phenomenon is limited to rotation of the polarizer 18, measuring the phase of the signal at the working frequency provides information on the angular position of the polarizer.

When the sensitive component 20 is a magneto-optical component subjected to a magnetic field H, this field is related to the angle of rotation $\theta$ of the polarization plane induced by the component 20 by the following equation:

$$\theta = V L H$$

where:
V is the Verdet constant; and
L is the length of the component 20.

The equation giving the light flux delivered by the sensor shows that the phase of the light signal is indeed modulated by the angle of rotation of the plane of light polarization, and that the sensor 14 constitutes a transducer of the external phenomenon producing this rotation.

Figure 3:
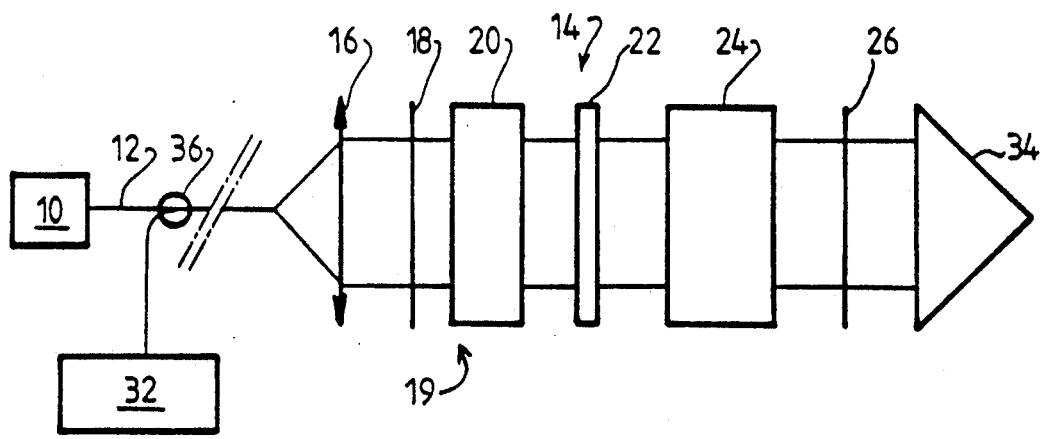
FIG. 3 is a diagram of a variant embodiment of the detection and measurement system and of the sensor of the invention.

In the variant embodiment shown in FIG. 3, the sensor 14 operates by reflection and at its end opposite from its end connected to the light source 10 it comprises a reflecting component 34 with an analyzer 26 placed in front of it. The component 34 is preferably of the retroreflector type, such as a corner of a cube. Otherwise the structure of the sensor is identical to that of the embodiment shown in FIG. 1, i.e. it includes a collimator lens 16 connecting it to the optical fiber 12, the transducer system 19, the quarterwave plate 22, and the birefringent crystal 24.

A Y-coupler 36 is provided on the optical fiber 12 to transmit the signal provided by the sensor 14 to the apparatus 32 for analyzing the light.

The light flux provided by the sensor 14 can be written in the following form:

$$P_c(\sigma) = (3/16)\cos^2\delta T'_c P_o(\sigma)[1 + (4/3)\cos(2\pi\sigma e - 2\theta) + (\tfrac{1}{3})\cos 2(2\pi\sigma e - 2\theta)]$$

where:

$T'_c$ is the transmission factor of the sensor which is passed through in both directions; and
$\cos^2\delta$ is an attenuation factor due to passing through the reflector 34.

Putting the go-and-return paths in series by interposing the analyzer 26 ahead of the reflector component 34 is the only method that makes it possible to have access to the looked-for transducer phenomenon in a reflection assembly. The use of a retroreflector also guarantees the quality and the stability of the retrocoupling with the optical fiber.

Figure 4:
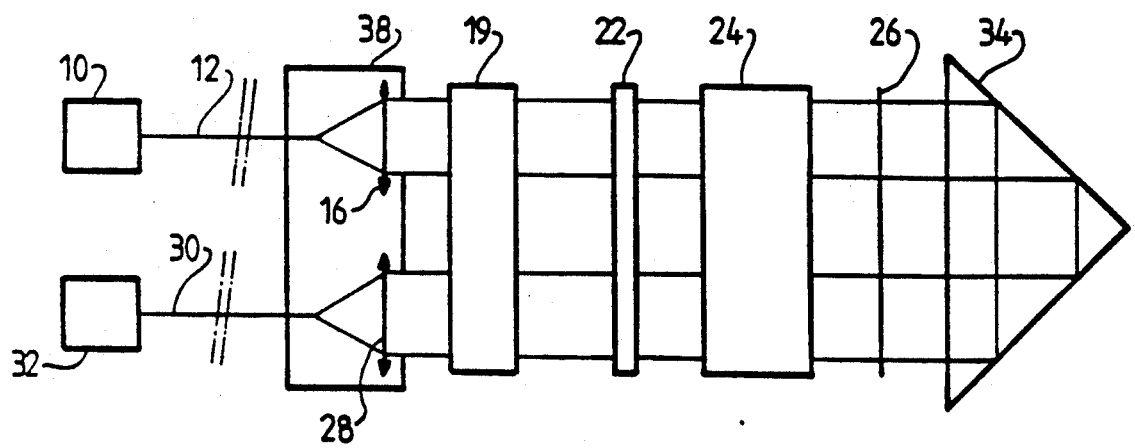
FIG. 4 is a diagrammatic view of another variant embodiment of the system in accordance with the invention.

A possible intermediate solution is shown in FIG. 4. In this case, the two lenses 16 and 28 are mounted side by side and are fixed to a single mechanical frame 38 with their optical axes being parallel. The optical fibers 12 and 30 are placed at the focuses of these optical systems so that they generate two beams of rays that are equally parallel. The retroreflector component 34 of the corner of a cube type folds back and offsets the beam with the desired tolerance characteristics that are analogous to those of the reflection assembly. By having the assembly 12 and 16 in the proximity of the assembly 30 and 28, it is possible to guarantee their relative stability better than in a transmission assembly. The active components 19, 22, 24, and 26 need intercept only one of the beams (transmission type operation) or they may intercept both beams (reflection type operation).

When the phenomenon analyzed is at low frequency and corresponds to direct rotation of the polarizer 18, performing measurements at two wavelengths (provided by two different sources) at the encoding frequency makes it possible to recover two different items of information, namely:

firstly $(2\pi/\lambda_1)\cdot e\Delta n - 2\theta = \phi_1$, and secondly $(2\pi/\lambda_2)\cdot e\Delta n - 2\theta = \phi_2$.

By calculating the difference between these two quantities it is possible to evaluate effects that are directly related to the structure of the encoding crystal (in particular the temperature dependency of its birefringence) and to take account thereof when evaluating the parameter:

$$\phi_2 - \phi_1 = (2\pi/\Lambda)e\Delta n$$

where $\Lambda = (\lambda_1 \cdot \lambda_2)/(\lambda_1 - \lambda_2)$ ($\phi_2 - \phi_1$ is independent of $\theta$ and makes it possible to calculate $e\Delta n$).

This method can also be used when transducing a magnetic field, but less directly, in that the Verdet constant of a substance is, to a first approximation, inversely proportional to the square of the wavelength.

When making use of reflection type operation, two modulation frequencies are available, one of which is twice the other, and this can be taken advantage of to eliminate possible drift in the center wavelength from the source 10.

In a variant, when the phenomenon analyzed is high frequency rotation of the analyzer 18, measuring the oscillation frequency of the signal provides information directly on the frequency of rotation of the analyzer (to within a factor of two). In this case, possible drift in the encoding crystal or in the center wavelength from the source is automatically eliminated since it arises only at low frequency (about one Hertz or less).

Finally, when the external phenomenon (e.g. the magnetic field) is of the type that varies in alteration or sinusoidally at a given angular frequency, the useful signals provided by the sensor and the analysis apparatus 32 are analogous to those provided by a pseudo-heterodyne demodulator and they may be processed in similar manner by means of filters tuned to twice the above-mentioned angular frequency and to harmonics thereof.

I claim:

1. A sensor for detecting and measuring the rotation of a plane of polarization of light in a polarizing optical means, the sensor comprising:
   a source of incoherent light;
   an optical fiber connected at a first end to said source;
   a polarizing optical means connected to a second end of said optical fiber for polarizing the incoherent light;
   a light spectrum modulating device responsive to the polarized light of the polarizing optical means, said light spectrum modulating device comprising an achromatic quarterwave plate, a birefringent crystal and an analyzer;
   a second optical fiber connected at a first end to said light spectrum modulating device; and
   a light spectrum analyzer apparatus connected to a second end of said second optical fiber;
   wherein said polarizing optical means is responsive to an external influence by rotating a plane of polarization of said light in said polarizing optical means in response to said external influence.

2. A sensor according to claim 1, wherein the neutral axes of the quarterwave plate are oriented at 45° to the neutral axes of the birefringent crystal.

3. A sensor according to claim 2 wherein the polarization direction of said analyzer coincides with one of the neutral axes of the quarterwave plate.

4. A sensor according to claim 1, operating in transmission, wherein its end opposite to its end connected to the light source is connected via an optical fiber to an analyzer apparatus.

5. A sensor according to claim 1, operating in reflection, wherein its end opposite to its end connected to the light source including optical reflection means, said analyzer being placed between the birefringent crystal and said optical reflection means.

6. A sensor according to claim 1, wherein the polarizing optical means comprises a stationary polarizer and a magneto-optical component responsive to a magnetic field.

7. A sensor according to claim 1, wherein the polarizing optical means is constituted by a polarizer mounted to rotate about the optical axis of the sensor.

8. A sensor according to claim 1, wherein the polarizing optical means comprises a stationary polarizer and a component having rotatory polarization.

9. A sensor according to claim 1, comprising optical reflection means and two parallel-axis collimator lenses lying side by side in a common frame, one of said lenses being connected via an optical fiber to the source and the other of said lenses being connected via an optical fiber to the light spectrum analyzer apparatus, the polarizing optical means, the birefringent crystal, the quarterwave plate, and the analyzer all being interposed between one of said lenses and optical reflection means.

10. A sensor according to claim 1, wherein, for a low frequency external influence acting on the polarizing optical means, the light spectrum analyzer apparatus is tuned to the frequency related to the birefringent crystal and the source delivers light fluxes centered on two different wavelengths.

11. A sensor according to claim 1, wherein the polarizing optical means comprises a polarizer rotating at high speed, and the source delivers a light flux whose frequency of oscillation corresponds to within a factor of two to the frequency of rotation of the rotating polarizer.

12. A sensor according to claim 1, wherein the external influence acting on the polarizing optical means is periodically alternating, and the light spectrum analyzer apparatus comprises a differential amplifier circuit, an analog phase calculation circuit, and filters tuned respectively to a low frequency corresponding to twice the angular frequency of the external influence and to harmonics of said low frequency.

13. A sensor according to claim 1, wherein the achromatic quarterwave plate of the light spectrum modulating device is placed adjacent said birefringent crystal.

14. A sensor according to claim 1, wherein the light spectrum analyzer apparatus is a demodulating interferometer.

* * * * *